(12) United States Patent
Park et al.

(10) Patent No.: US 10,050,227 B2
(45) Date of Patent: Aug. 14, 2018

(54) DISPLAY APPARATUS

(71) Applicant: SAMSUNG DISPLAY CO., LTD., Yongin-si, Gyeonggi-do (KR)

(72) Inventors: Donghee Park, Yongin-si (KR); Cheolgeun An, Yongin-si (KR); Jihoon Oh, Yongin-si (KR); Chungseok Lee, Yongin-si (KR); Euiyun Jang, Yongin-si (KR); Jeongho Hwang, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/410,371

(22) Filed: Jan. 19, 2017

(65) Prior Publication Data
US 2017/0294620 A1 Oct. 12, 2017

(30) Foreign Application Priority Data

Apr. 8, 2016 (KR) ........................ 10-2016-0043508

(51) Int. Cl.
*H01L 51/52* (2006.01)
*H01L 27/32* (2006.01)
(Continued)

(52) U.S. Cl.
CPC ...... *H01L 51/5253* (2013.01); *G02F 1/13452* (2013.01); *G02F 1/136209* (2013.01); *H01L 27/3272* (2013.01); *H01L 27/3276* (2013.01); *H01L 51/0097* (2013.01); *H01L 51/5284* (2013.01); *G02F 1/13454* (2013.01); *G02F 1/133305* (2013.01); *G02F 1/133512* (2013.01); *G02F 2201/50* (2013.01); *H01L 2251/5338* (2013.01)

(58) Field of Classification Search
CPC ......... H01L 51/00; H01L 51/52; H01L 51/05; H01L 51/5253; H01L 27/12; H01L 27/32; H01L 27/146; H01L 27/01; H01L 31/02; H01L 31/0203; H01L 31/042; H01L 29/04; H01L 29/24; H01L 29/66; H01L 29/786
USPC ......................................... 257/91
See application file for complete search history.

(56) References Cited

U.S. PATENT DOCUMENTS 9,202,855 B1 12/2015 Jo et al.
2009/0066862 A1* 3/2009 Ishii ................. G02F 1/133308
349/12

(Continued)

FOREIGN PATENT DOCUMENTS

JP 2007-227559 A 9/2007

OTHER PUBLICATIONS

Extended European Search Report by the EPO dated Aug. 16, 2017 in the examination of the European Application No. 17165586.3.

*Primary Examiner* — Chuong A Luu
(74) *Attorney, Agent, or Firm* — Lee & Morse, P.C.

(57) ABSTRACT

A display apparatus includes a substrate, a display unit on a first surface of the substrate, and a protection film on a second surface, opposite the first surface, of the substrate. The protection film includes a first adhesive layer having a first surface that faces the second surface of the substrate; a protection film base having a first surface that faces a second surface, opposite the first surface, of the first adhesive layer; and a light blocking layer having a first surface that faces a second surface, opposite the first surface of the protection film base.

20 Claims, 11 Drawing Sheets

(51) Int. Cl.
*H01L 51/00* (2006.01)
*G02F 1/1345* (2006.01)
*G02F 1/1362* (2006.01)
*G02F 1/1333* (2006.01)
*G02F 1/1335* (2006.01)

(56) References Cited

U.S. PATENT DOCUMENTS

| | | |
|---|---|---|
| 2014/0042406 A1 | 2/2014 | Degner et al. |
| 2015/0130726 A1 | 5/2015 | Min et al. |
| 2016/0118416 A1* | 4/2016 | Yamazaki ............ H01L 51/525 349/38 |
| 2016/0372606 A1* | 12/2016 | Ito ..................... H01L 29/78693 |
| 2017/0168333 A1* | 6/2017 | Kubota .................. G06F 3/044 |

\* cited by examiner

DISPLAY APPARATUS

CROSS-REFERENCE TO RELATED APPLICATION

Korean Patent Application No. 10-2016-0043508, filed on Apr. 8, 2016, in the Korean Intellectual Property Office, and entitled: "Display Apparatus," is incorporated by reference herein in its entirety.

BACKGROUND

1. Field

One or more embodiments relate to a display apparatus, and more particularly, to a display apparatus having improved visibility.

2. Description of the Related Art

In general, a display apparatus includes a display on a substrate. In this regard, it is necessary to make an image be clearly visible to a user while the image is displayed on the display.

SUMMARY

According to one or more embodiments, a display apparatus includes a substrate; a display unit placed on a first surface of the substrate; and a protection film on a second surface, opposite the first surface, of the substrate. The protection film may include a first adhesive layer having a first surface that faces the second surface of the substrate, a protection film base having a first surface that faces a second surface, opposite the first surface, of the first adhesive layer, and a light blocking layer having a first surface that faces a second surface, opposite the first surface, of the protection film base.

The light blocking layer may block visible light.

The display apparatus may further include a heat sink film on a second surface, opposite the first surface of the light blocking layer. The protection film may further include a second adhesive layer placed between the light blocking layer and the heat sink film.

The display apparatus may further include a cushion layer on a second surface, opposite the first surface, of the light blocking layer. The protection film may further include a second adhesive layer placed between the light blocking layer and the cushion layer.

The substrate may have a display area and a peripheral area outside the display area, the display unit may be in the display area, the display apparatus may further include a printed circuit board bonded to a portion of the peripheral area, the portion including a first edge portion of the substrate, and a length of the first edge portion may be equal to a width of a part of the printed circuit board mounted on the first edge portion.

The substrate may have a display area and a peripheral area outside the display area, the display unit may be placed over the display area, and the display apparatus may further include an electronic chip attached to a portion of the peripheral area including a first edge portion; and a compensating film covering a top surface of the substrate which is between the display area and the first edge portion.

A thickness of the compensating film may be equal to a thickness of the electronic chip.

The compensating film may completely cover the top surface of the substrate which is between the display area and the first edge portion, except where the electronic chip is attached.

The display apparatus may further include a printed circuit board attached to the portion of the peripheral area including the edge portion, wherein the printed circuit board does not overlap the electronic chip, and the compensating film may cover a portion of the printed circuit board which overlaps the substrate. A distance from the first surface of the substrate to a top surface of the compensating film may be uniform in an entire portion of the compensating film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
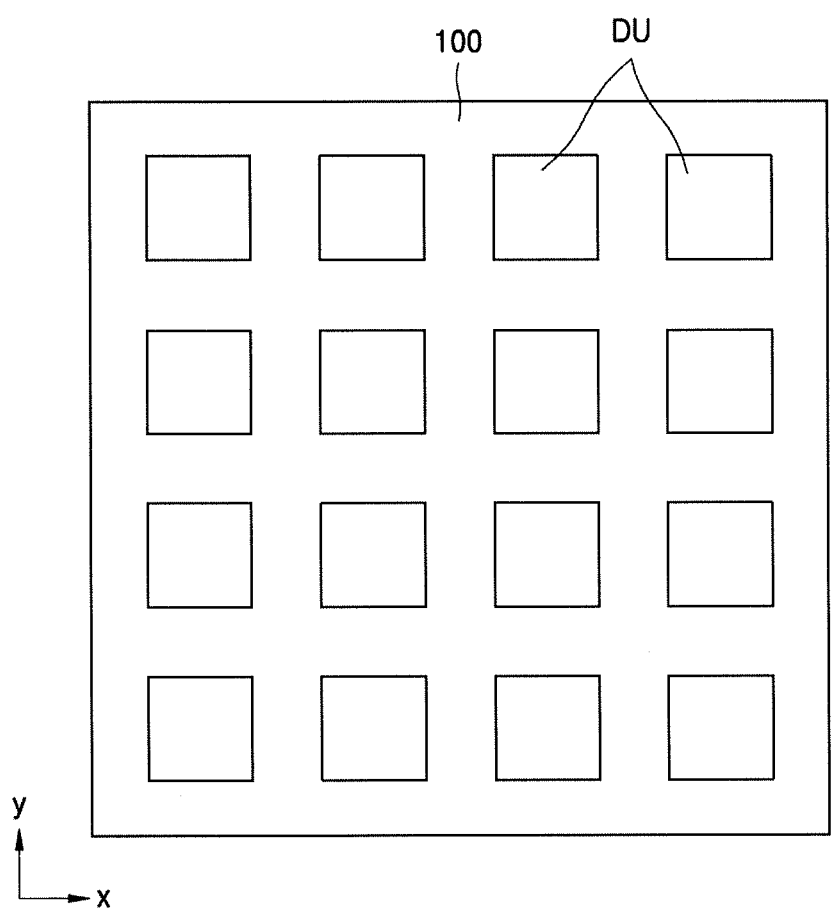
FIG. 1 illustrates a plan view and FIGS. 2 through 7 illustrate cross-sectional views of stages in a process of manufacturing a display apparatus, according to an embodiment.

As the present disclosure allows for various changes and numerous embodiments, particular embodiments will be illustrated in the drawings and described in detail in the written description. Effects and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein.

Reference will now be made in detail to embodiments, examples of which are illustrated in the accompanying drawings, wherein like reference numerals refer to like elements throughout and redundant descriptions thereof are not provided here.

Throughout the specification, it will also be understood that when various elements including a layer, a film, a region, a plate, or the like are referred to as being "over" another layer, film, region, or plate, it can be directly on the other layer, film, region, or plate, or intervening layer, film, region, or plate may also be present therebetween. In the drawings, for convenience of description, the thicknesses of elements may be exaggerated for clarity. For example, the thicknesses and sizes of elements in the drawings are arbitrarily shown for convenience of description, thus, the spirit and scope of the present invention are not necessarily defined by the drawings.

Hereinafter, in one or more embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

As used herein, the term "and/or" includes any and all combinations of one or more of the associated listed items. Expressions such as "at least one of," when preceding a list of elements, modify the entire list of elements and do not modify the individual elements of the list.

FIGS. 1 through 7 are each a plan view or a cross-sectional view illustrating stages in a process of manufacturing a display apparatus, according to an embodiment.

First, as illustrated in FIG. 1, a plurality of display units DU are formed on a top surface of a mother substrate 100. Before the display units DU are formed, other processes may be previously performed. For example, a process of forming a buffer layer on an entire surface of the mother substrate 100 may be previously performed. When the display units DU are formed, display devices and electronic devices, e.g., thin-film transistors, to be electrically connected to the display devices may be formed. Electronic devices may be formed at a periphery of a display area in which the display devices are formed. In addition, when the display units DU are formed, an encapsulation layer may be formed to protect the display devices. A detailed configuration of each of the display units DU will be described in detail below.

The mother substrate 100 on which the display units DU are formed may include various materials having a flexible or bendable characteristic. For example, the mother substrate 100 may include a polymer resin such as polyethersulphone (PES), polyacrylate, polyetherimide (PEI), polyethylene naphthalate (PEN), polyethyleneterepthalate (PET), polyphenylene sulfide (PPS), polyarylate (PAR), polyimide, (PI), polycarbonate (PC), or cellulose acetate propionate (CAP).

Figure 2:
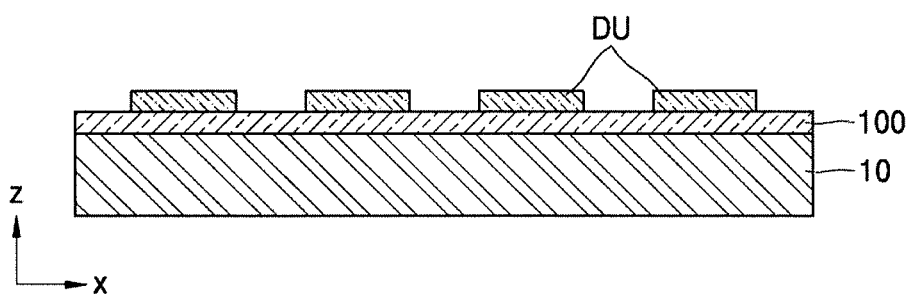

When the display units DU are formed as illustrated in FIG. 1, the display units DU may be formed on the mother substrate 100 on a carrier substrate 10 as illustrated in FIG. 2. The carrier substrate 10 may include a glass having a sufficient thickness. The carrier substrate 10 has a sufficient rigidity to prevent the mother substrate 100 including the flexible or bendable characteristic from being twisted or deformed during a manufacturing procedure. For example, the mother substrate 100 may be formed on the carrier substrate 10 having the sufficient rigidity and then the display units DU may be formed on the mother substrate 100.

Figure 3:
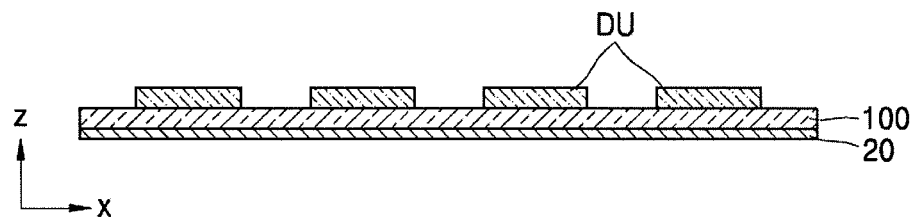

After the display units DU are formed, the mother substrate 100 may be separated from the carrier substrate 10. Then, as illustrated in FIG. 3, a temporary protection film 20 may be attached to a bottom surface of the mother substrate 100 from which the carrier substrate 10 is separated (in −z direction). The temporary protection film 20 is to prevent the bottom surface of the mother substrate 100 from being damaged during the manufacturing procedure. Since the temporary protection film 20 is removed during the manufacturing procedure as described below, adhesion between the temporary protection film 20 and the mother substrate 100 may be weak, as described below.

Figure 4:
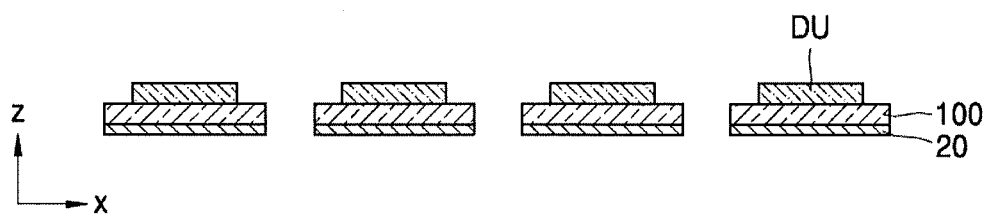

The temporary protection film 20 is attached to the bottom surface of the mother substrate 100, and then the temporary protection film 20 and the mother substrate 100 are simultaneously cut. In more detail, the temporary protection film 20 and the mother substrate 100 are cut around each of the display units DU. Thus, as illustrated in FIG. 4, a plurality of display panels are obtained. A cutting operation with respect to the temporary protection film 20 and the mother substrate 100, i.e., to separate the display units, may be performed in various ways, e.g., using a laser beam, a cutting wheel, and so forth, along the z-axis from the temporary protection film 20 side and/or the mother substrate 100 side. More than one cutting operation and/or more than one type of cutting operation may be performed to separate the display units.

Figure 5:
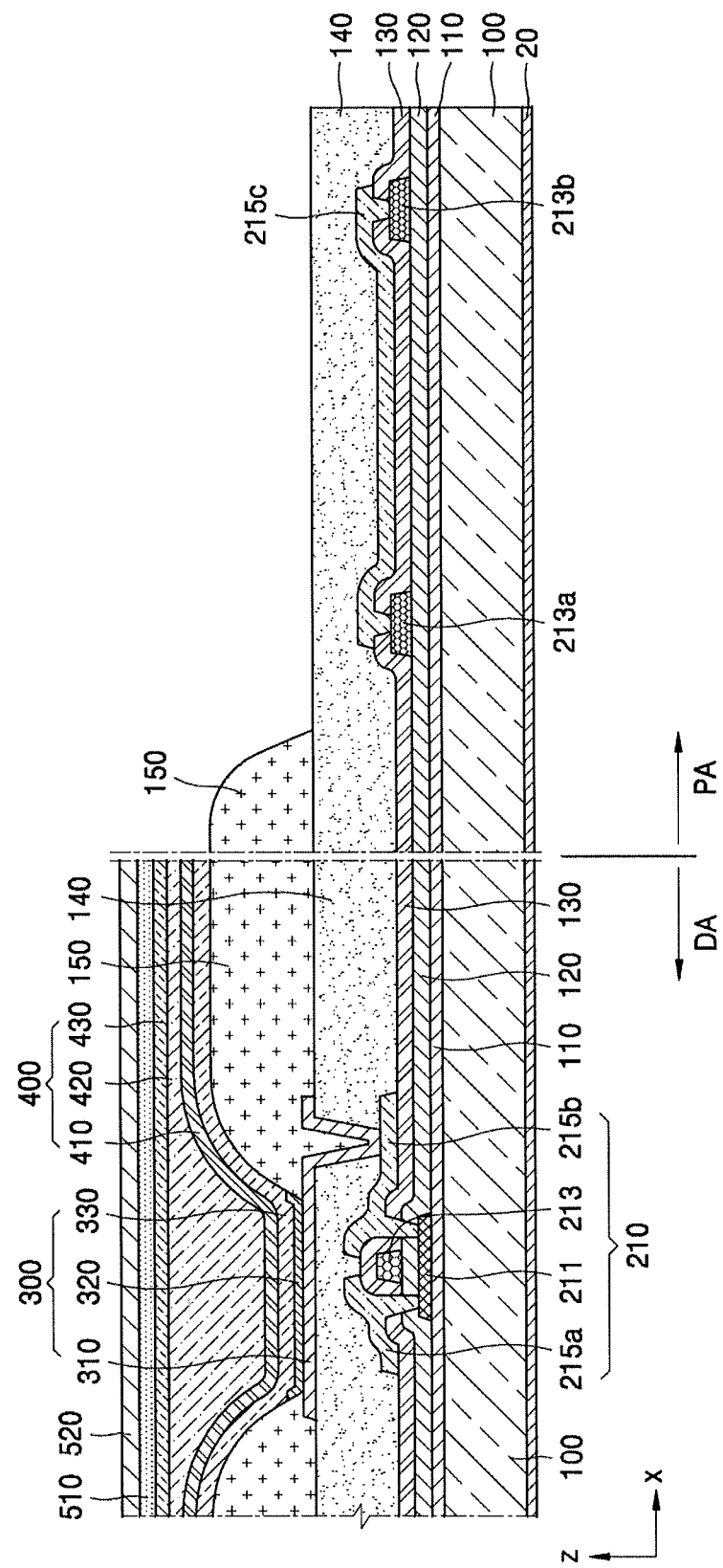

FIG. 5 illustrates a cross-sectional view of a portion of one of the display panels obtained in the aforementioned manner. As illustrated in FIG. 5, each of the display panels has a display area DA and a peripheral area PA at a periphery of the display area DA. As understood by one of ordinary skill in the art, a substrate may have the display area DA and the peripheral area PA at the periphery of the display area DA. Hereinafter, for convenience of description, a substrate of each of the display panels will now be described below by using a reference numeral of the mother substrate 100.

In the display area DA of each display panel, a display device 300 and a thin-film transistor 210, to which the display device 300 is electrically connected, may be placed. Referring to FIG. 5, an organic light-emitting device is placed as the display device 300 in the display area DA. As understood by one of ordinary skill in the art, the fact that the organic light-emitting device is electrically connected to the thin-film transistor 210 may mean that a pixel electrode 310 is electrically connected to the thin-film transistor 210. If required, a thin-film transistor may be placed at the periphery of the display area DA of the substrate 100. The thin-film transistor at the periphery may be a part of a circuit unit to control an electric signal to be applied into the display area DA.

The thin-film transistor 210 may include a semiconductor layer 211 including amorphous silicon, polycrystalline silicon, or an organic semiconductor material, a gate electrode 213, a source electrode 215a, and a drain electrode 215b. In order to achieve insulation between the semiconductor layer 211 and the gate electrode 213, a gate insulating layer 120 including an inorganic material, e.g., silicon nitride and/or silicon oxynitride, may be interposed between the semiconductor layer 211 and the gate electrode 213. In addition, an interlayer insulating layer 130 including an inorganic material, e.g., silicon oxide, silicon nitride, and/or silicon oxynitride, may be arranged on the gate electrode 213, and the source electrode 215a and the drain electrode 215b may be arranged on the interlayer insulating layer 130. The insulating layers including the inorganic materials may be formed by chemical vapor deposition (CVD), atomic layer deposition (ALD), and so forth. This is applied to embodiments and modified embodiments thereof described later. The insulating layers 120 and 130 may extend into the peripheral area PA, e.g., may extend along an entirety of the substrate 100.

A buffer layer 110 may be interposed between the thin-film transistor 210 and the substrate 100. The buffer layer 110 may include an inorganic material such as silicon oxide, silicon nitride, and/or silicon oxynitride. The buffer layer 110 may increase a planar characteristic of a top surface of the substrate 100 and/or may prevent or minimize impurities from the surface 100 or the like from penetrating into the semiconductor layer 211 of the thin-film transistor 210. The buffer layer 110 may extend into the peripheral area PA, e.g., may extend along an entirety of the substrate 100.

A planarization layer 140 may be arranged above the thin-film transistor 210. As illustrated in FIG. 5, when the organic light-emitting device is arranged on the thin-film transistor 210, the planarization layer 140 may generally planarize a top surface of a protection layer that covers the thin-film transistor 210. The planarization layer 140 may include an organic material, e.g., acryl, benzocyclobutene (BCB), hexamethyldisiloxane (HMDSO), and the like. Referring to FIG. 5, the planarization layer 140 is a single layer but may be modified to be multiple layers. In addition, the planarization layer 140 may have an opening at the periphery of the display area DA, so that a portion of the planarization layer 140 in the display area DA may be physically spaced apart from a portion of the planarization layer 140 in a second area 2A (refer to FIG. 9 or 10). By doing so, external impurities may be prevented from reaching an inner side of the display area DA via the planarization layer 140.

In the display area DA, the organic light-emitting device having the pixel electrode 310, an opposite electrode 330, and an intermediate layer 320 interposed therebetween, and including an emission layer may be placed on the planarization layer 140. As illustrated in FIG. 5, the pixel electrode 310 contacts one of the source electrode 215a and the drain electrode 215b via an opening formed in the planarization layer 140 and thus is electrically connected to the thin-film transistor 210.

A pixel-defining layer 150 may be arranged on the planarization layer 140. The pixel-defining layer 150 is arranged to define a pixel by having an opening to expose an opening corresponding to each sub-pixel, i.e., a center portion of the pixel electrode 310. As illustrated in FIG. 5, the pixel-defining layer 150 is arranged to prevent an occurrence of an arc at a side edge of the pixel electrode 310 by increasing a distance between the side edge of the pixel electrode 310 and the opposite electrode 330 above the pixel electrode 310. The pixel-defining layer 150 may include an organic material, e.g., polyimide, hexamethyldisiloxane (HMDSO), and the like.

The intermediate layer 320 of the organic light-emitting device may include a small-molecule or polymer material. When the intermediate layer 320 includes the small-molecule material, the intermediate layer 320 may have a structure in which a hole injection layer (HIL), a hole transport layer (HTL), an emission layer (EML), an electron transport layer (ETL), an electron injection layer (EIL), and the like are singularly or multiply stacked, and may include various organic materials, e.g., copper phthalocyanine (CuPc), N,N'-Di(naphthalene-1-yl)-N,N'-diphenyl-benzidine (NPB), tris-8-hydroxyquinoline aluminum)(Alq3), and the like. The aforementioned layers may be formed by using a vacuum deposition method.

When the intermediate layer 320 includes the polymer material, the intermediate layer 320 may have a structure generally including a HTL and an EML. In this regard, the HTL may include poly-(2,4)-ethylene-dihydroxy thiophene (PEDOT), and the EML may include poly-phenylenevinylene (PPV)-based polymer materials, polyfluorene-based polymer materials, and the like. The intermediate layer 320 may be formed by using a screen printing method, an inkjet printing method, a laser induced thermal imaging (LITI) method, or the like.

The intermediate layer 320 is not limited thereto and thus may have one of various structures. In addition, the intermediate layer 320 may include one layer extending over the pixel electrodes 310, or may include a layer that is patterned to correspond to each of the pixel electrodes 310.

The opposite electrode 330 is arranged in an upper part in the display area DA and, as illustrated in FIG. 5, the opposite electrode 330 may cover the display area DA. That is, the opposite electrode 330 may be formed as one body with respect to a plurality of the organic light-emitting devices and, thus, may correspond to the pixel electrodes 310.

The organic light-emitting device may be easily damaged due to external moisture or oxygen, thus, an encapsulation layer 400 may cover the organic light-emitting device so as to protect it. The encapsulation layer 400 may cover the display area DA and may extend over the periphery of the display area DA. As illustrated in FIG. 5, the encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include, e.g., silicon oxide, silicon nitride, and/or silicon oxynitride. If required, other layers such as a capping layer, and the like may be interposed between the first inorganic encapsulation layer 410 and the opposite electrode 330. The first inorganic encapsulation layer 410 is formed along a structure therebelow. Thus, as illustrated in FIG. 5, a top surface of the first inorganic encapsulation layer 410 is not planar. The organic encapsulation layer 420 covers the first inorganic encapsulation layer 410 and, unlike the first inorganic encapsulation layer 410, a top surface of the organic encapsulation layer 420 may be generally planar.

In more detail, a top surface of the organic encapsulation layer 420 may be planar in the display area DA. The organic encapsulation layer 420 may include at least one of polyethyleneterephthalate, polyethylenenaphthalate, polycarbonate, polyimide, polyethylenesulfonate, polyoxymethylene, polyarylate, and hexamethyldisiloxane. The second inorganic encapsulation layer 430 may cover the organic encapsulation layer 420, and may include silicon oxide, silicon nitride, and/or silicon oxynitride. The second inorganic encapsulation layer 430 may contact the first inorganic encapsulation layer 410 in a border of the periphery of the display area DA and, thus, may prevent the organic encapsulation layer 420 from being externally exposed.

As described above, since the encapsulation layer 400 includes the first inorganic encapsulation layer 410, the organic encapsulation layer 420, and the second inorganic encapsulation layer 430, if a crack is generated in the encapsulation layer 400, the aforementioned multi-stack structure prevents the crack from being connected between the first inorganic encapsulation layer 410 and the organic encapsulation layer 420 or between the organic encapsulation layer 420 and the second inorganic encapsulation layer 430. Thus, a path for penetration of external moisture or oxygen into the display area DA may be prevented or minimized.

In addition to the aforementioned elements, the display panel may include, if required, variously-patterned touch electrodes or a touch protection film to protect the touch electrodes. The display panel may have a first conductive layer 215c and/or a second conductive layer 213a or 213b in the peripheral area PA. In particular, the second conductive layers 213a or 213b may be on the insulating layer 120. For example, as illustrated in FIG. 5, the first conductive layer 215c may have a shape extending toward (in +x direction) a border of the substrate 100, and may be electrically connected to the second conductive layer 213a or 213b arranged therebelow. The first conductive layer 215c may extend sufficiently to cover and be in contact with the second conductive layers 213a, 213b via through holes in the insulating layer 130. The planarization layer may extend into the peripheral area PA. The pixel defining layer 150 may partially extend into the peripheral area PA, e.g., may not overlap the second conductive layers 213a, 213b.

A shape of the second conductive layer 213a or 213b is not limited to an island shape as illustrated in FIG. 5 and, thus, may extend in various directions. For example, the second conductive layer 213a in the peripheral area PA may be electrically connected to a thin-film transistor in the display area DA, so that the first conductive layer 215c may be electrically connected to the thin-film transistor in the display area DA via the second conductive layer 213a. The second conductive layer 213b in the peripheral area PA may also be electrically connected to the thin-film transistor in the display area DA by the second conductive layer 213a and the first conductive layer 215c. As described above, the second conductive layer 213a or 213b at the periphery of the display area DA may be electrically connected to the elements in the display area DA, or at least a portion of the second conductive layer 213a or 213b at the periphery of the display area DA may extend toward the display area DA and thus may be placed in the display area DA. That is, the first conductive layer 215c and/or the second conductive layer 213a or 213b may be wires that apply an electric signal into the display area DA.

The first conductive layer 215c may be simultaneously formed from a same material as the source electrode 215a or the drain electrode 215b in the display area DA, and the second conductive layer 213a or 213b may be simultaneously formed from a same material as the gate electrode 213 in the display area DA.

Figure 9:
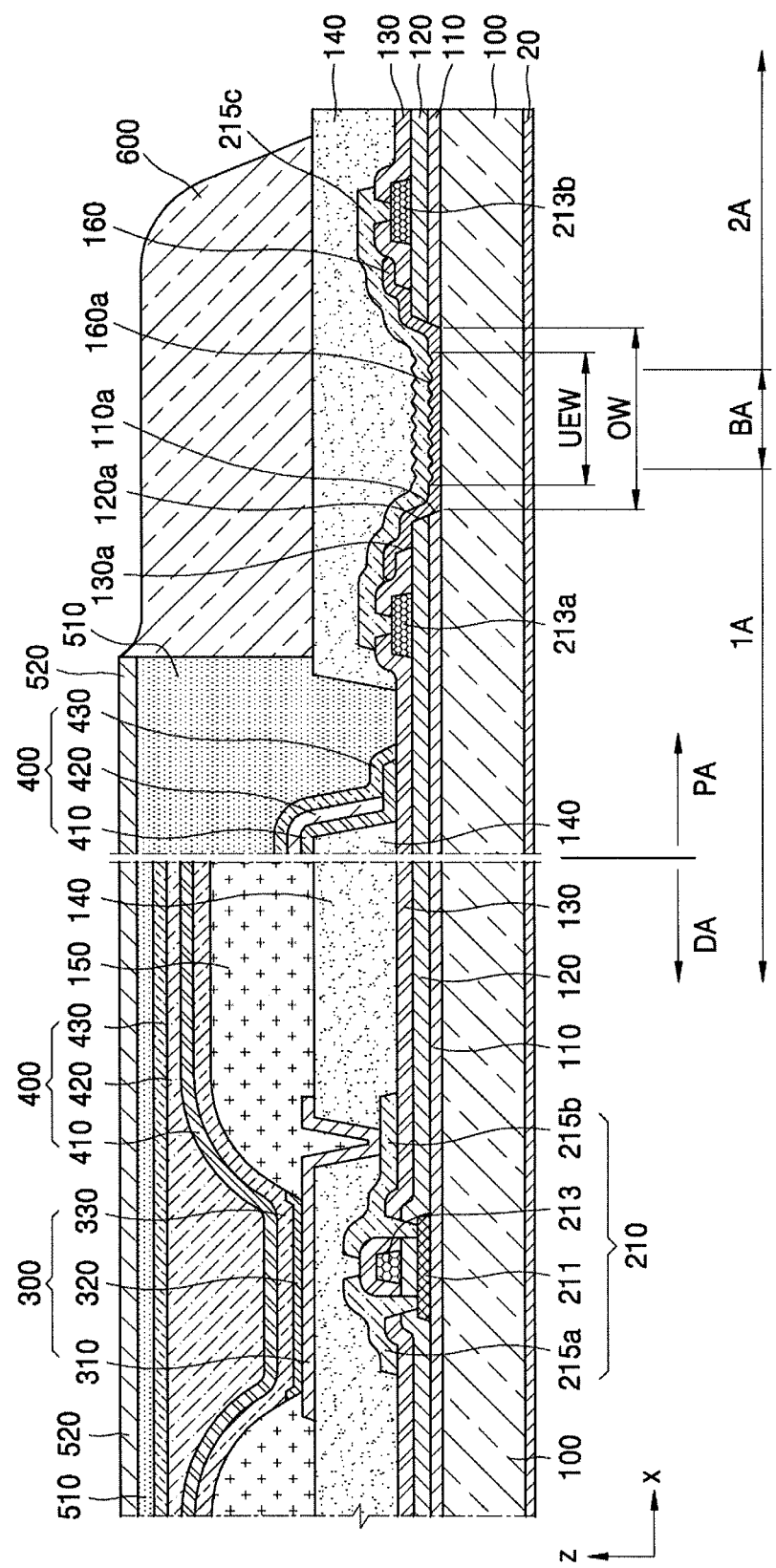
Figure 10:
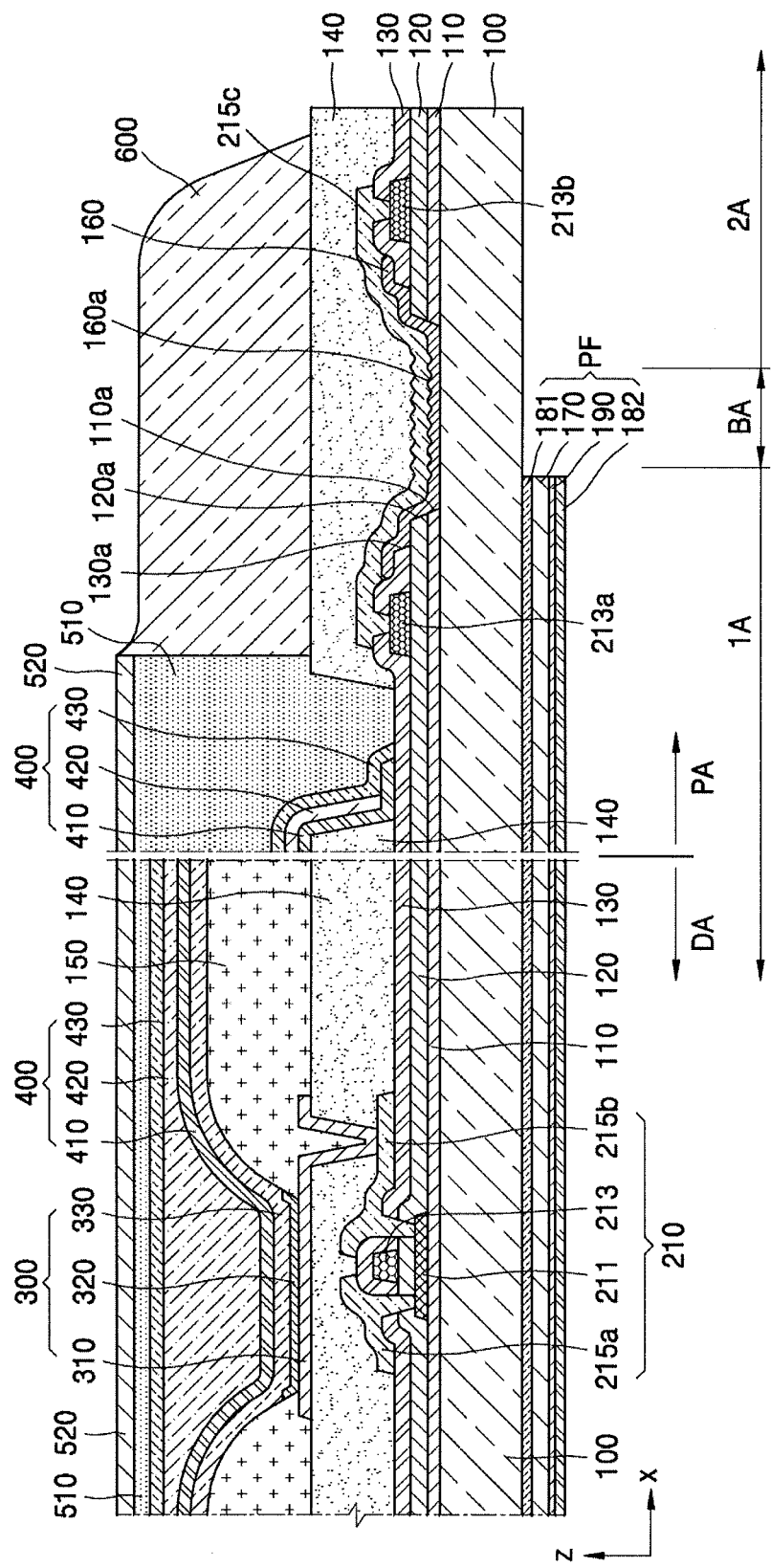

After the display panel with the aforementioned structure is arranged, elements for the display panel may be formed. For example, a polarizing plate 520 may be bonded to the encapsulation layer 400 by using an optically clear adhesive (OCA) 510. The polarizing plate 520 may be arranged to reduce reflection of external light. For example, when external light passes through the polarizing plate 520, is reflected from a top surface of the opposite electrode 330, and then passes again through the polarizing plate 520, a phase of the external light may be changed, since the external light passes through the polarizing plate 520 twice. As a result, destructive interference occurs since a phase of reflected light becomes different from the phase of the external light entering the polarizing plate 520, so that reflection of the external light may be decreased, improving visibility. As illustrated in FIG. 9 or 10, the OCA 510 and the polarizing plate 520 may cover the opening of the planarization layer 140.

The display apparatus according to the present embodiment does not always have to include the polarizing plate 520, and if required, the display apparatus may include other configurations other than the polarizing plate 520. For example, the display apparatus may include a black matrix and a color filter other than the polarizing plate 520 and thus may decrease reflection of external light.

Figure 6:
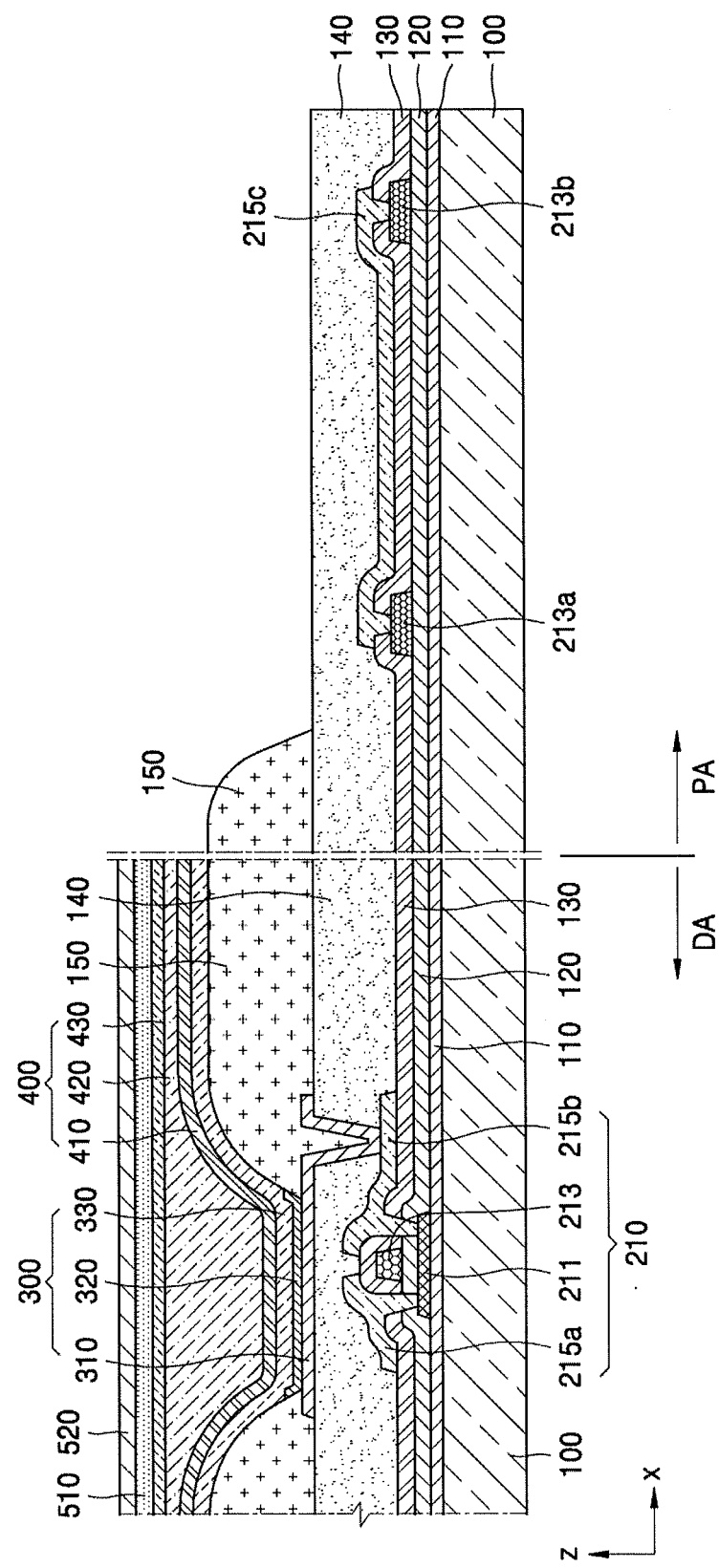
Figure 7:
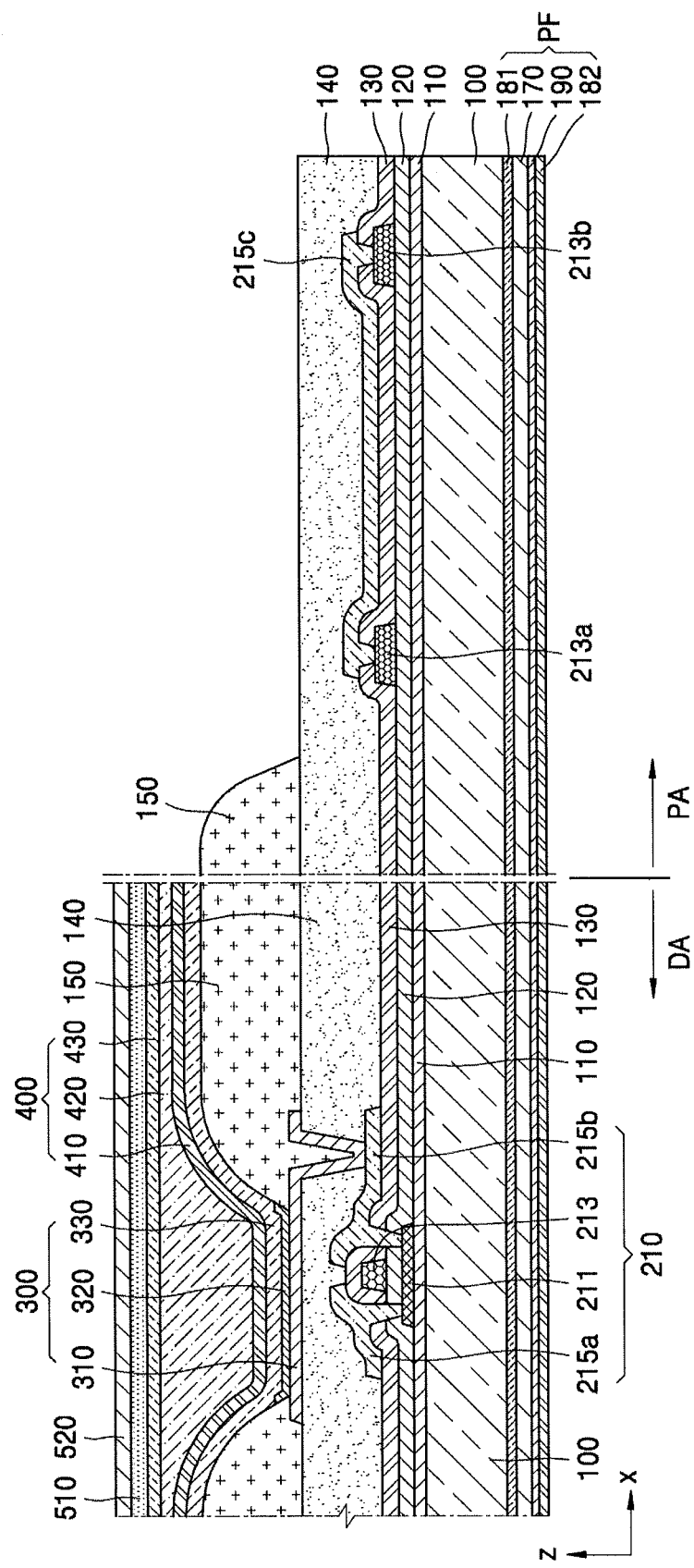

Afterward, as illustrated in FIG. 6, the temporary protection film 20 may be removed from the display panel. Then, as illustrated in FIG. 7, a protection film PF may be bonded to a bottom surface of the display panel (in −z direction).

The display apparatus according to the embodiment is manufactured via the aforementioned procedure and as a result, the display apparatus includes the substrate 100, a display unit placed above a top surface of the substrate 100 (in +z direction) and including the display device 300 such as an organic light-emitting device, and the protection film PF placed on a bottom surface of the substrate 100 (in −z direction). Here, the protection film PF includes a first adhesive layer 181, a protection film base 170, a light blocking layer 190, and a second adhesive layer 182.

A first surface of the first adhesive layer 181 faces. e.g., contacts or directly contacts, the bottom surface of the substrate 100 (in −z direction), and a second surface that is opposite to the first surface faces, e.g., contacts or directly contacts, a first surface of the protection film base 170. The light blocking layer 190 is placed in an opposite direction (in −z direction) with respect to a direction toward the first adhesive layer 181 from the protection film base 170. In other words, a first surface of the light blocking layer 190 may face, e.g., contact or directly contact, a second surface of the protection film base 170. The second adhesive layer 182 is placed in an opposite direction (in −z direction) with respect to a direction toward the protection film base 170 from the light blocking layer 190. In other words, a first surface of the second adhesive layer 182 may face, e.g., contact or directly contact, a second surface of the light blocking layer 190. In the manufacturing procedure, the protection film PF including the first adhesive layer 181, the protection film base 170, the light blocking layer 190, and the second adhesive layer 182 may be prepared as a unit, which is then bonded to the bottom surface of the substrate 100.

The first adhesive layer 181 included in the protection film PF is arranged to allow the protection film PF to be bonded to the bottom surface of the substrate 100. The first adhesive layer 181 may include a pressure sensitive adhesive (PSA).

When the protection film PF including the first adhesive layer 181 is bonded to the bottom surface of the substrate 100, bubbles may become trapped between the bottom surface of the substrate 100 and the first adhesive layer 181. To reduce or eliminate the trapping of bubbles, a surface of the first adhesive layer 181 may include minute unevenness. Thus, when the protection film PF is bonded starting from a side of the substrate 100, e.g., a border in −x direction, toward the substrate 100 in +x direction, air may be moved in +x direction through the minute unevenness of the surface of the protection film PF. Thus, when the protection film PF is finally bonded to the bottom surface of the substrate 100, bubbles trapped between the protection film PF and the substrate 100 may be reduced or eliminated.

The surface of the first adhesive layer 181 may have the minute unevenness by using one of various methods. For example, a minutely embossed surface of a mold may be pressed onto the first adhesive layer 181, a surface roughening process may be used, and so forth.

The protection film base 170 included in the protection film PF may include polyethyleneterephthalate (PET) or polyimide (PI). As described above, the protection film base 170 may be bonded to the bottom surface of the substrate 100 by using the first adhesive layer 181. The protection film base 170 may determine an overall shape of the protection film PF.

Likewise, in regard to the protection film base 170, the light blocking layer 190 included in the protection film PF may be placed to directly contact the protection film base 170 as illustrated in FIG. 7. The light blocking layer 190 may be printed or coated on the protection film base 170 by using a black ink. The light blocking layer 190 may block visible light.

As in the case of the first adhesive layer 181, the second adhesive layer 182 below the light blocking layer 190 may include a PSA. Although not illustrated in FIG. 7, various layers or structures to be described below may be bonded to the protection film PF.

As described above, the substrate 100 of the display apparatus according to the present embodiment includes various materials having a flexible or bendable characteristic, thus, the display apparatus also has a flexible or bendable characteristic. The fact that the display apparatus has the flexible or bendable characteristic means that structures other than the protection film PF may not be placed below (in −z direction) the substrate 100 of the display apparatus as illustrated in FIG. 7. If other structures are placed below the substrate 100, an overall flexible or bendable characteristic of the display apparatus may deteriorate.

If a user views an image displayed by the display unit, the user may see a portion of a background placed below the substrate 100, thus, visibility of the image displayed by the display unit may deteriorate. That is, a portion of light from the background placed below the substrate 100 may pass through the substrate 100, the buffer layer 110, the gate insulating layer 120, the interlayer insulating layer 130, the planarization layer 140, the pixel-defining layer 150 and/or the opposite electrode 330 and then may be recognized by the user. Accordingly, the visibility of the image displayed by the display unit may deteriorate.

However, as described above, in the display apparatus according to the present embodiment, since the protection film PF including the light blocking layer 190 is bonded to the bottom of the substrate 100, a large portion of the light from the background placed below the substrate 100 may be blocked by the light blocking layer 190. Thus, visibility of the image displayed by the display unit may be efficiently improved.

As described above, since the protection film PF includes both the first adhesive layer 181 and the second adhesive layer 182, another element may be bonded to the protection film PF via the second adhesive layer 182. For example, a heat sink film HSF (refer to FIG. 17) including graphite or copper may be bonded to the second adhesive layer 182 of the protection film PF, so that heat that may be generated when the display unit displays the image may be externally dissipated away. Alternatively, a cushion layer having elasticity may be bonded to the second adhesive layer 182 of the protection film PF so as to protect the display apparatus against an external shock. Alternatively, the display apparatus may have both the HSF and the cushion layer.

In any case, the aforementioned additional layers are attached to the protection film PF via the second adhesive layer 182 of the protection film PF. Therefore, except for the first adhesive layer 181 and the protection film base 170, the light blocking layer 190 of the protection film PF may be placed to be the most adjacent to the bottom surface of the substrate 100. By doing so, external light may be efficiently blocked, so that the visibility of the image displayed by the display unit may be sharply improved.

If a distance between the bottom surface of the substrate 100 and the light blocking layer 190 is increased, a portion of light travelling toward the display apparatus in a lateral direction (in +x direction) of the display apparatus may enter the inside of the display apparatus via a gap between the substrate 100 and the light blocking layer 190, such that the visibility of the image displayed by the display unit may deteriorate. However, in the display apparatus according to the present embodiment, except for the first adhesive layer 181 and the protection film base 170, the light blocking layer 190 of the protection film PF is placed to be the most adjacent to the bottom surface of the substrate 100. Therefore, not only a large portion of the light from the background placed below the substrate 100 but also a large portion of the light in the lateral direction of the substrate 100 may be blocked by the light blocking layer 190 of the protection film PF, so that the visibility of the image displayed by the display unit may be sharply improved.

In the aforementioned descriptions, the protection film PF includes the first adhesive layer 181, the protection film base 170, the light blocking layer 190, and the second adhesive layer 182, the present disclosure is not limited thereto. For example, the protection film PF may include only the first adhesive layer 181, the protection film base 170, and the light blocking layer 190. In this case, not only the large portion of the light from the background placed below the substrate 100 but also the large portion of the light in the lateral direction of the substrate 100 may also be blocked by the light blocking layer 190 of the protection film PF, so that the visibility of the image displayed by the display unit may be sharply improved.

Figure 8:
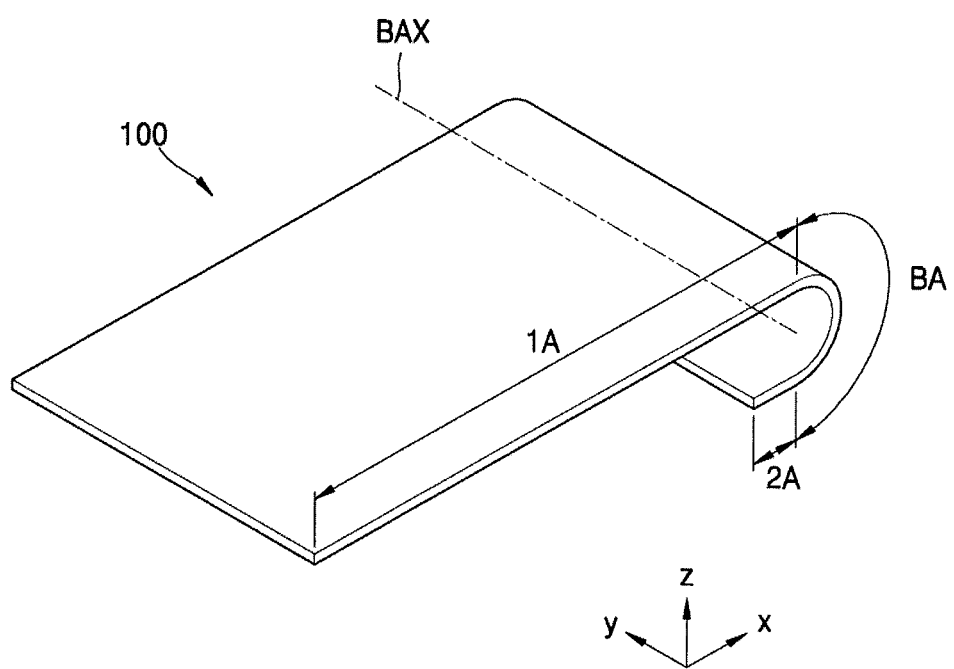
FIG. 8 illustrates a perspective view and FIGS. 9 and 10 illustrate cross-sectional views of stages in a process of manufacturing a display apparatus, according to another embodiment.

Unlike as illustrated in FIGS. 5 through 7, at least a portion of a display apparatus may be bent. FIGS. 8 through 10 are each a perspective view or a cross-sectional view illustrating stages in a process of manufacturing the display apparatus, according to another embodiment. For example, as illustrated in FIG. 8, a portion of the display apparatus may be bent. FIG. 8 illustrates only the substrate 100.

In this case, the substrate 100 may have a first area 1A, a second area 2A, and a bent area BA between the first area 1A and the second area 2A along the x-axis, e.g., along which top and bottom surfaces of the substrate 100 extends. As understood by one of ordinary skill in the art, the aforementioned display area DA may be a portion of the first area 1A. That is, the first area 1A includes the display area DA. The first area 1A may include both the display area DA and a portion of the peripheral area PA at the periphery of the display area DA. The second area 2A may also include the peripheral area PA. When required, if a display is performed in a bent area, the display area DA may be arranged not only in the first area 1A but also may be arranged in the bending area BA, and furthermore, the display area DA may be arranged in at least a portion of the second area 2A. Hereinafter, for convenience of description, it is assumed that the display area DA is arranged in the first area 1A.

Before the substrate 100 or the like is bent as illustrated in FIG. 8, a display panel as illustrated in FIG. 9 may be obtained. The display panel has the temporary protection film 20 bonded to a bottom surface of the substrate 100. After the temporary protection film 20 is removed, a protection film PF as illustrated in FIG. 10 may be bonded thereto. A configuration of the protection film PF may be the same as described above. Unlike to the case of FIG. 7 in which the protection film PF is bonded to an entire portion of the bottom surface of the substrate 100, the protection film PF may not be bonded to the entire portion of the bottom surface of the substrate 100 but may cover only a portion of the bottom surface of the substrate 100. In more detail, the protection film PF covers a large portion of the first area 1A of the substrate 100 and does not cover the bending area BA.

As illustrated in FIG. 10, an end of the protection film PF in a direction of the second area 2A may be placed in the first area 1A, so that the end may not overlap with the bending area BA and may not contact the bending area BA.

In this manner, the protection film PF is bonded to the bottom surface of the substrate 100 and then the display panel is bent, so that, the display panel may be bent as illustrated in FIG. 8. As described above, FIG. 8 illustrates only the substrate 100. A bent portion of the substrate 100 is the bending area BA, and the substrate 100 is bent with respect to a bending axis BAX that crosses a virtual straight line that connects (in +x direction) a center of the first area 1A and a center of the second area 2A.

In this regard, as described above, since the protection film PF has a shape corresponding to the first area 1A and thus is not present in the bending area BA, when the display panel is bent, a defect due to the protection film PF does not occur. Since the protection film PF protects the bottom surface of the substrate 100, the protection film PF may have hardness. Therefore, if the protection film PF is present in the bending area BA and has low flexibility, when the substrate 100 is bent, delamination may occur between the protection film PF and the substrate 100. Alternatively, if the protection film PF is present in the bending area BA, when the substrate 100 is bent, a portion of the protection film PF in the bending area BA may be wrinkled resulting in a defect. However, in the display apparatus according to the present embodiment, the protection film PF is not present in the bending area BA, thus, it is possible to prevent an occurrence of the defect during a process of bonding the protection film PF and bending the display panel.

Unlike as illustrated in FIG. 10, the protection film PF may cover at least a portion of the second area 2A. That is, the protection film PF may be variously modified so that the protection film PF may have an opening corresponding to the bending area BA and thus may mostly or completely cover the first area 1A and may simultaneously cover at least a portion of the second area 2A.

In the display panel, the buffer layer 110, the gate insulating layer 120, and the interlayer insulating layer 130 that include an inorganic material may be collectively referred to as an inorganic insulating layer. As illustrated in FIGS. 9 and 10, the inorganic insulating layer may have an opening corresponding to the bending area BA. That is, the buffer layer 110, the gate insulating layer 120, and the interlayer insulating layer 130 may respectively have openings 110a, 120a, 130a each corresponding to the bending area BA. When the opening corresponds to the bending area BA, it may mean that the opening overlaps with the bending area BA. In this regard, an area of the opening may be larger than an area of the bending area BA. To do so, referring to FIG. 9, a width OW of the opening is greater than a width of the bending area BA. In this regard, the area of the opening may be defined as an area of one of the openings 110a, 120a, 130a, having a smallest area. Referring to FIG. 9, the area of the opening is defined as an area of the opening 110a of the buffer layer 110.

Referring to FIGS. 9 and 10, an inner surface of the opening 110a of the buffer layer 110 matches with an inner surface of the opening 120a of the gate insulating layer 120, but the present disclosure is not limited thereto. For example, an area of the opening 120a of the gate insulating layer 120 may be larger than the area of the opening 110a of the buffer layer 110. In this case, the area of the opening may be defined as an area of one of the openings 110a, 120a, 130a, having a smallest area.

At least a portion of the opening of the inorganic insulating layer is covered with an organic layer 160. Referring to FIG. 9, the organic layer 160 completely fills the opening. In addition, the aforementioned first conductive layer 215c may be placed on the organic layer 160. In an area where the organic layer 160 is not present, the first conductive layer 215c may be placed on the inorganic insulating layer such as the interlayer insulating layer 130.

As described above with reference to FIG. 10, after the protection film PF is bonded to the bottom surface of the substrate 100, the display panel is bent in the bending area BA as illustrated in FIG. 8. Here, while the substrate 100 is bent in the bending area BA, a tensile stress may be applied to the first conductive layer 215c, but in the display apparatus according to the present embodiment, an occurrence of a defect in the first conductive layer 215c during the bending process may be prevented or minimized.

If the inorganic insulating layer, e.g., the buffer layer 110, the gate insulating layer 120, and/or the interlayer insulating layer 130, does not have an opening in the bending area BA and thus has a shape extending from the first area 1A to the second area 2A, and the first conductive layer 215c is placed on the inorganic insulating layer, when the substrate 100 is bent, a great tensile stress is applied to the first conductive layer 215c. In particular, since hardness of the inorganic insulating layer is higher than that of the organic layer, there is a very high probability that a crack. etc. may occur in the inorganic insulating layer in the bending area BA, and if the crack occurs in the inorganic insulating layer, a crack, etc. also occurs in the first conductive layer 215c on the inorganic insulating layer, so that a probability that a defect such as disconnection of the first conductive layer 215c occurs is significantly increased.

However, in the display apparatus according to the present embodiment, the inorganic insulating layer has the opening in the bending area BA as described above, and a portion of the first conductive layer 215c that corresponds to the bending area BA is placed on the organic layer 160 filling at least a portion of the opening of the inorganic insulating layer. Since the inorganic insulating layer has the opening in the bending area BA, a probability that a crack occurs in the inorganic insulating layer is extremely low, and since the organic layer 160 includes an organic material, a probability that a crack occurs therein is low. Therefore, in the display apparatus according to the present embodiment, an occurrence of a crack in the portion of the first conductive layer 215c corresponding to the bending area BA and placed on the organic layer 160 may be prevented or may be minimized. Since the organic layer 160 has hardness less than that of the inorganic insulating layer, the organic layer 160 may effectively minimize a tensile stress concentrated on the first conductive layer 215c by absorbing the tensile stress generated by the bending of the substrate 100, etc.

Since the first conductive layer 215c crossing the bending area BA includes a highly extensible material, a defect, e.g., a crack, in the first conductive layer 215c or disconnection of the first conductive layer 215c may not occur. In addition, in the first area 1A or the second area 2A, the second conductive layer 213a or 213b includes a material having a lower extension rate than that of the first conductive layer 215c and having electrical and physical features different from those of the first conductive layer 215c, so that an electric signal may be efficiently delivered in the display apparatus or a defect rate while the display apparatus is manufactured may be decreased. For example, the second conductive layer 213a or 213b may include molybdenum, and the first conductive layer 215c may include aluminum. If required, the first conductive layer 215c or the second conductive layer 213a or 213b may have a multi-stack structure.

In a case of the second conductive layer 213b in the second area 2A, unlike to those illustrated in FIGS. 9 and 10, at least a portion of a top surface of the second conductive layer 213b may not be covered with the planarization layer 140, etc. but may be exposed to the outside and thus may be electrically connected to various electronic devices or a printed circuit board.

As illustrated in FIGS. 9 and 10, the organic layer 160 may have an uneven surface 160a on a portion of its top surface (in +z direction). Since the organic layer 160 has the uneven surface 160a, a top surface and/or a bottom surface of the first conductive layer 215c on the organic layer 160 may have a shape corresponding to the uneven surface 160a of the organic layer 160.

As described above, while the substrate 100 is bent in the bending area BA, the tensile stress may be applied to the first conductive layer 215c, but since the top surface and/or the bottom surface of the first conductive layer 215c has the shape corresponding to the uneven surface 160a of the organic layer 160, an amount of the tensile stress applied to the first conductive layer 215c may be minimized. That is, in the display apparatus according to the present embodiment, the tensile stress that may occur during a bending process may be decreased via deformation of the shape of the organic layer 160 having low hardness, and in this case, since the first conductive layer 215c whose shape is uneven before the bending process is deformed to correspond to a shape of the organic layer 160 which is deformed due to the bending, an occurrence of a defect, e.g., disconnection of the first conductive layer 215c, may be effectively prevented.

In addition, the surface area of the top surface of the organic layer 160 and the surface areas of the top and bottom surfaces of the first conductive layer 215c inside the opening of the inorganic insulating layer may be increased by forming the uneven surface 160a on at least a portion of the top surface (in +z direction) of the organic layer 160. The fact that the surface areas of the top surface of the organic layer 160 and the top and bottom surfaces of the first conductive layer 215c are wide means that a margin by which the organic layer 160 and the first conductive layer 215c may be deformed to reduce the tensile stress by the bending of the substrate 100 increases.

In this regard, since the first conductive layer 215c is placed on the organic layer 160, the bottom surface of the first conductive layer 215c has the shape corresponding to the uneven surface 160a of the organic layer 160. However, the top surface of the first conductive layer 215c may have an uneven surface whose shape does not correspond to the uneven surface 160a of the organic layer 160.

The uneven surface 160a of the top surface (in +z direction) of the organic layer 160 may be formed by using at least one of various methods. For example, a photoresist material is used when forming the organic layer 160, and a specific portion may be etched (removed) relatively further than other portions by differing the amount of exposure applied to a plurality of portions of the organic layer 160 whose top surface is approximately flat by using a slit mask or a half-tone mask during a manufacturing process. Here, the further etched portion may be understood as a concave portion in the top surface of the organic layer 160. As understood by one of ordinary skill in the art, the method used when manufacturing the display apparatus according to the present embodiment is not limited to the above method. For example, after the organic layer 160 whose upper surface is approximately flat is formed, only a specific portion may be removed by dry etching, or various methods may be used.

In order to have the uneven surface 160a in the top surface of the organic layer 160 (in +z direction), the organic layer 160 may include a plurality of grooves extending in a first direction (in +y direction) in the top surface thereof (in +z direction). In this case, the shape of the top surface of the first conductive layer 215c on the organic layer 160 corresponds to the shape of the top surface of the organic layer 160.

The organic layer 160 may include the uneven surface 160a inside only the opening of the inorganic insulating layer. FIG. 9 illustrates that a width UEW of a portion including the uneven surface 160a of the organic layer 160 is narrower than the width OW of the opening of the inorganic insulating layer.

If the organic layer 160 includes the uneven surface 160a inside and outside the opening of the inorganic insulating layer, the organic layer 160 includes the uneven surface 160a in the neighborhood of the inner surface of the opening 110a of the buffer layer 110, or the inner surface of the opening 120a of the gate insulating layer 120, or the inner surface of the opening 130a of the interlayer insulating layer 130. Since a portion of the organic layer 160 corresponding to the concave portion of the uneven surface 160a has a relatively thin thickness compared to the thickness of a portion of the organic layer 160 that protrudes, if the concave portion is placed near the inner surface of the opening 110a of the buffer layer 110, the inner surface of the opening 120a of the gate insulating layer 120, or the inner surface of the opening 130a of the interlayer insulating layer 130, the organic layer 160 may not continuously extend, but may be disconnected. Therefore, by having the uneven surface 160a only inside the opening of the inorganic insulating layer, disconnection of the organic layer 160 in the neighborhood of the inner surface of the opening 110a of the buffer layer 110, the inner surface of the opening 120a of the gate insulating layer 120, or the inner surface of the opening 130a of the interlayer insulating layer 130 may be reduced or prevented.

As described above, in order to prevent disconnection, etc. of the first conductive layer 215c from occurring in the bending area BA, the organic layer 160 may include the uneven surface 160a in the bending area BA. Therefore, consequently, the area of the portion including the uneven surface 160a of the organic layer 160 may be allowed to be greater than the area of the bending area BA but to be smaller than the area of the opening. This is illustrated in FIG. 9 in which the width UEW of the portion including the uneven surface 160a of the organic layer 160 is greater than the width of the bending area BA and smaller than the width OW of the opening. e.g., along the x-axis.

If at least one of the buffer layer 110, the gate insulating layer 120, the interlayer insulating layer 130 includes an organic insulating material, when a layer including the organic insulating material is formed, the organic layer 160 may be simultaneously formed, and in this regard, the layer including the organic insulating material and the organic layer 160 may be integrally formed. The organic insulating material may include polyethyleneterephthalate, polyethylenenaphthalate, polycarbonate, polyimide, polyethylenesulphonate, polyoxymethylene, polyarylate, or hexamethyldisiloxane.

As shown in FIGS. 9 and 10, the planarization layer 140 may extend from the display area DA into the peripheral area PA, such that the planarization layer 140 may cover the second conductive layers 213a, 213b. The planarization layer 140 may have a gap in the peripheral area PA such that the gap is interposed between the display area DA and the second conductive layers 213a, 213b. The encapsulation layer 400 may cover a top and sidewall of the planarization layer 140 in the peripheral area PA adjacent the display area DA. The OCA 510 may fill a region including an opening in the planarization layer 140 in the peripheral area PA, i.e., to cover the encapsulation layer 400 and both edges of the planarization layer 140, such that the OCA 510 in the peripheral region PA is coplanar with the OCA 510 in the display area DA. The polarizing plate 520 may extend on the planar surface of the OCA 510 in both the display area DA and the peripheral area PA.

Before the temporary protection film 20 is removed from the display panel as illustrated in FIG. 9, a bending protection layer (BPL) 600 may be further arranged at a periphery of the display area DA. That is, the BPL 600 may be placed over the first conductive layer 215c while the BPL 600 corresponds to the bending area BA. In particular, the BPL 600 may extend, e.g., continuously extend, along the x-axis in a portion of the first area 1A, the bending area BA, and a portion of the second area 2A.

When a certain stacked body is bent, a stress neutral plane exists inside the stacked body. If the BPL 600 does not exist, when the substrate 100 or the like is bent, an excessive tensile stress, etc. may be applied to the first conductive layer 215c inside the bending area BA as described above. This is because the location of the first conductive layer 215c may not correspond to a stress neutral plane. However, by allowing the BPL 600 to exist and adjusting a thickness, a modulus, etc. of the BPL 600, the location of the stress neutral plane may be adjusted in a stacked body including all of the substrate 100, the first conductive layer 215c, the BPL 600, etc. Therefore, a tensile stress applied to the first conductive layer 215c may be minimized by allowing the stress neutral plane to be placed at a periphery of the first conductive layer 215c via the BPL 600.

Unlike as illustrated in FIGS. 9 and 10, the BPL 600 may extend up to the edge of the substrate 100 of the display apparatus. For example, in the second area 2A, at least a portion of the first conductive layer 215c, the second conductive layer 213b, and/or other conductive layers or the like that are electrically connected to these layers may not be covered with the interlayer insulating layer 130 or the planarization layer 140, etc. but may be electrically connected to various electronic devices or a printed circuit board, etc. Accordingly, portions via which the first conductive layer 215c, the second conductive layer 213b, and/or other conductive layers electrically connected to these layers are electrically connected to the various electronic devices or the printed circuit board, etc. exist. In this case, the electrically connected portion needs to be protected against impurities such as external moisture, and since the BPL 600 covers even the electrically connected portion, the BPL 600 may function as a protection layer. For this purpose, the BPL 600 may extend up to the edge of the substrate 100 of the display apparatus.

Referring to FIGS. 9 and 10, a top surface of the BPL 600 in a direction of the display area DA (in −x direction) matches with the top surface (in +z direction) of the polarizing plate 520, i.e., be coplanar therewith, and may extend along and contact the OCA 510 and the polarizing plate 520 in the z direction, but the present disclosure is not limited thereto. For example, an end of the BPL 600 in the direction of the display area DA (in −x direction) may cover a portion of an edge top surface of the polarizing plate 520. Alternatively, the end of the BPL 600 in the direction of the display area DA (in −x direction) may not contact the polarizing plate 520 and/or the OCA 510.

In the aforementioned descriptions with reference to FIGS. 9 and 10, the inorganic insulating layer corresponds to the bending area BA. However, the present disclosure is not limited thereto. For example, the buffer layer 110 may be one layer continuously extending over the first area 1A, the bending area BA, and the second area 2A. In addition, each of the gate insulating layer 120 and the interlayer insulating layer 130 may have an opening. In this case, as understood by one of ordinary skill in the art, the inorganic insulating layer including the buffer layer 110, the gate insulating layer 120, and the interlayer insulating layer 130 may not have an opening but may have a groove. Not only the buffer layer 110 but also the gate insulating layer 120 may be one layer continuously extending over the first area 1A, the bending area BA, and the second area 2A, and only the interlayer insulating layer 130 may have the opening. Even in this case, as understood by one of ordinary skill in the art, the inorganic insulating layer including the buffer layer 110, the gate insulating layer 120, and the interlayer insulating layer 130 may not have the opening but may have the groove. In this manner, even when the inorganic insulating layer has the groove, the organic layer 160 may fill the groove. That is, a structure in which the opening of the inorganic insulating layer in the aforementioned descriptions is replaced with the groove also belongs to the scope of the present disclosure.

Figure 11:
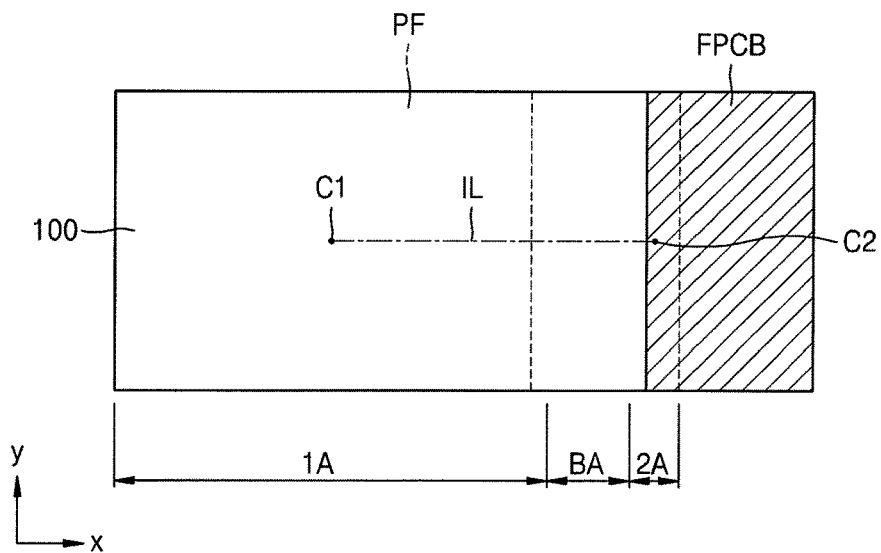
FIG. 11 illustrates a plan view of a portion of a display apparatus, according to another embodiment.

FIG. 11 is a plan view illustrating a portion of a display apparatus, according to another embodiment. Referring to FIG. 11, the display apparatus according to the present embodiment further includes a flexible printed circuit board FPCB. The flexible printed circuit board FPCB is bonded to a portion of a peripheral area including an edge portion of the substrate 100, wherein the edge portion from among edge portions of the substrate 100 is placed in +x direction and extends in +y direction. Referring to FIG. 11, the printed circuit board FPCB is bonded to a portion of the second area 2A of the substrate 100.

As described above with reference to FIGS. 1 through 4, when the plurality of display panels are simultaneously manufactured, the bonding of the flexible printed circuit board FPCB may be performed after the plurality of display panels are arranged by cutting the substrate 100 and the temporary protection film 20 as illustrated in FIG. 4, and then before the temporary protection film 20 is removed. In more detail, as described above, the polarizing plate 520 may be bonded to the encapsulation layer 400 by using the OCA 510, and then the flexible printed circuit board FPCB may be bonded to the display panel before the BPL 600 is coated. The flexible printed circuit board FPCB may be bonded to the second area 2A of the display panel to be electrically connected to the second conductive layer 213b.

In this regard, a +y direction length of the edge portion of the substrate 100 at which the flexible printed circuit board FPCB is placed may be equal to a width (+y direction width) of a portion of the flexible printed circuit board FPCB corresponding to the edge portion. That is, as illustrated in FIG. 11, a length of the second area 2A in a direction (in +y direction) that crosses a virtual straight line IL connecting a center C1 of the first area 1A and a center C2 of the second area 2A may be equal to a +y direction length of the flexible printed circuit board FPCB, the +y direction length crossing the virtual straight line IL.

Since the protection film PF is bonded after the temporary protection film 20 is removed as described above, the protection film PF is not present in the second area 2A to which the flexible printed circuit board FPCB is bonded. Therefore, when the temporary protection film 20 is removed and then the flexible printed circuit board FPCB is bonded to the second area 2A, due to a characteristic of the flexible display panel, the flexible printed circuit board FPCB may not be bonded to a correct location on the display panel. Thus, by allowing the flexible printed circuit board FPCB to be bonded to the second area 2A before the temporary protection film 20 is removed, the flexible printed circuit board FPCB may be bonded to the second area 2A of the display panel while the display panel is partially supported by the temporary protection film 20.

In this regard, since the +y direction length of the second area 2A which crosses the virtual straight line IL of the display panel is allowed to be equal to the +y direction length of the printed circuit board FPCB which crosses the virtual straight line IL, the display panel may not be deformed after the temporary protection film 20 is removed.

If the +y direction length of the flexible printed circuit board FPCB which crosses the virtual straight line IL is shorter than the +y direction length of the second area 2A which crosses the virtual straight line IL of the display panel, only a part of an edge portion of the second area 2A which extends in +y direction crossing the virtual straight line IL contacts the flexible printed circuit board FPCB. In this case, since the edge portion of the second area 2A does not completely contact the flexible printed circuit board FPCB, the second area 2A may not be uniformly supported by the flexible printed circuit board FPCB. As a result, the substrate 100 or the like may be deformed in the second area 2A. However, by allowing the +y direction length of the second area 2A which crosses the virtual straight line IL of the display panel to be equal to the +y direction length of the flexible printed circuit board FPCB which crosses the virtual straight line IL, the edge portion of the second area 2A completely contacts the flexible printed circuit board FPCB. Thus the second area 2A is uniformly supported by the flexible printed circuit board FPCB, so that a probability that the substrate 100 or the like is deformed in the second area 2A may be significantly decreased.

Figure 12:
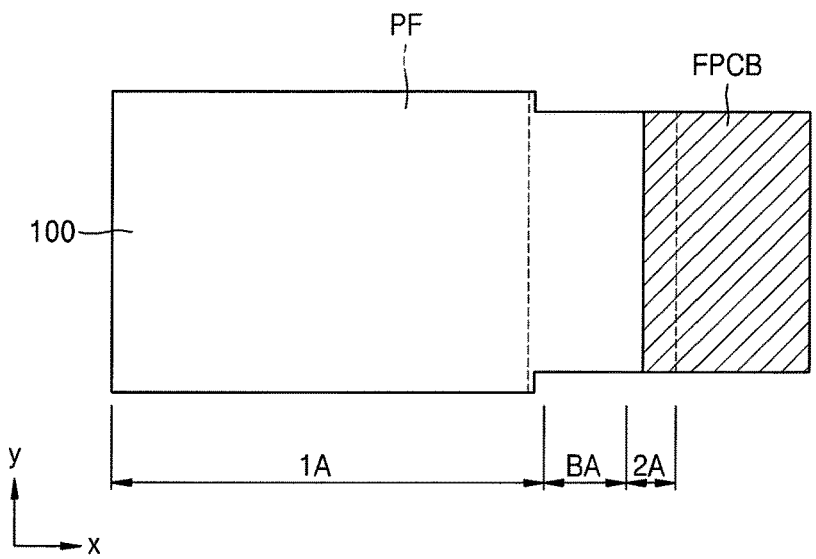
FIG. 12 illustrates a plan view of a portion of a display apparatus according to another embodiment.

As shown in FIG. 12, which illustrates a plan view of a portion of a display apparatus according to another embodiment, the substrate 100 may have a shape in which both end portions of the substrate 100 are removed from a bending area BA and a second area 2A in +x direction from a first area 1A to a second area 2A. That is, a +y direction width of the substrate 100 in the bending area BA and the second area 2A may be smaller than a +y direction width of the substrate 100 at a center of the first area 1A of the substrate 100. Even in this case, a +y direction length of an edge portion of the substrate 100 where the flexible printed circuit board FPCB is placed may be allowed to be equal to a width (+y direction width) of a portion of the flexible printed circuit board FPCB corresponding to the edge portion.

The substrate 100 may have a shape in which only one end portion among both end portions of the substrate 100 is removed from the bending area BA and the second area 2A in +x direction from the first area 1A to the second area 2A. Even in this case, consequently, a +y direction length of an edge portion of the substrate 100 where the printed circuit board flexible FPCB is placed may be allowed to be equal to a width (+y direction width) of a portion of the flexible printed circuit board FPCB corresponding to the edge portion.

Figure 13:
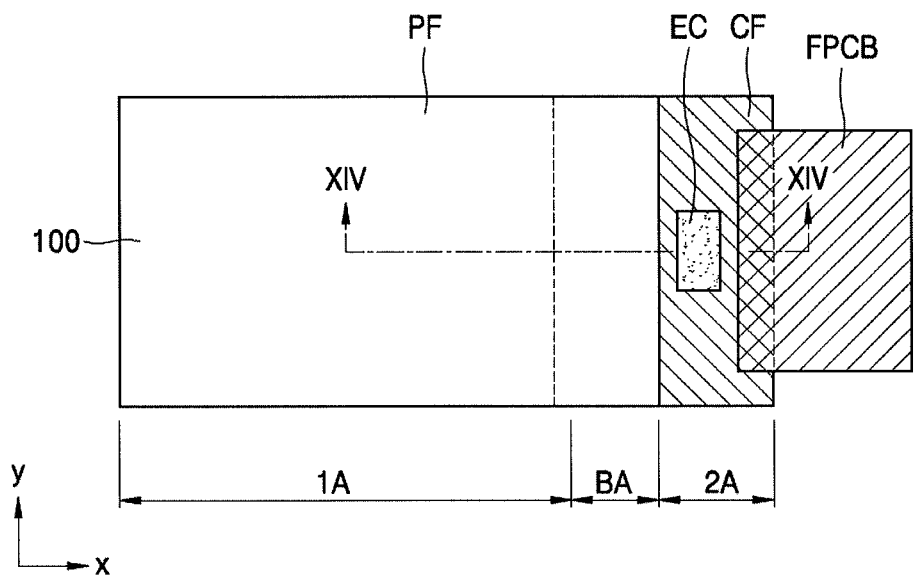
FIG. 13 illustrates a plan view of a portion of a display apparatus, according to another embodiment.
Figure 14:
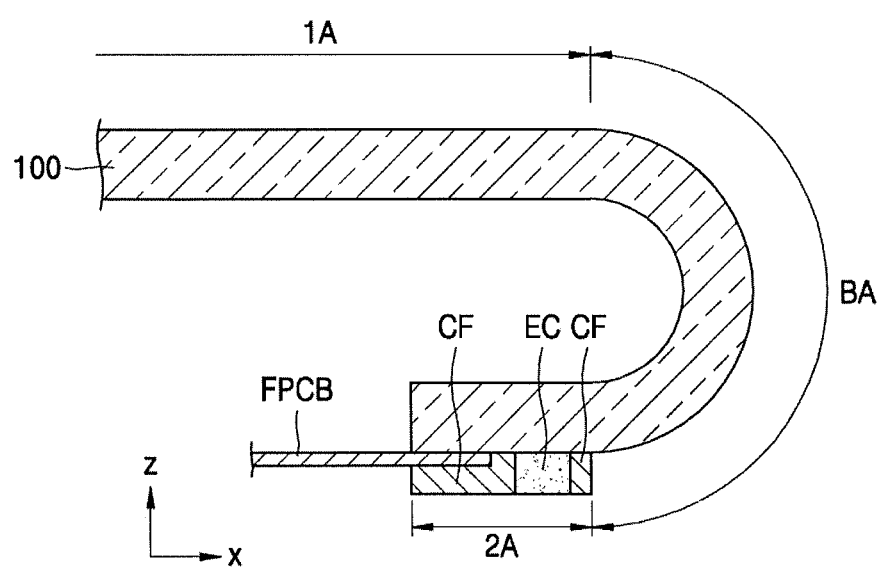
FIG. 14 illustrates a cross-sectional view of the display apparatus, taken along a line XIV-XIV of FIG. 13.

FIG. 13 is a plan view illustrating a portion of a display apparatus, according to another embodiment. FIG. 14 is a cross-sectional view of the display apparatus, taken along a line XIV-XIV of FIG. 13. The display apparatus according to the present embodiment has a shape in which a portion of the substrate 100 that is a part of the display apparatus is bent as illustrated in FIG. 14, thus, a portion of the display apparatus is also bent as the substrate 100.

However, for convenience of illustration, FIG. 13 illustrates the display apparatus in an unbent state. In addition, for convenience of illustration, FIG. 14 illustrates only the substrate 100, a flexible printed circuit board FPCB, an electronic chip EC, and a compensating film CF, and other elements are omitted.

In the display apparatus according to the present embodiment, the electronic chip EC is attached to a portion of a peripheral area including an edge portion from among edge portions of the substrate 100. Referring to FIG. 13, the electronic chip EC is placed in a second area 2A. The display apparatus according to the present embodiment further includes the compensating film CF, in addition to the electronic chip EC. The compensating film CF covers a top surface of the substrate 100, and is between the display area DA and the edge portion that is placed in +x direction and extends in +y direction.

If a size of the electronic chip EC is smaller than a size of the second area 2A of the substrate 100, all edges of the second area 2A do not contact the electronic chip EC. Thus, as understood by one of ordinary skill in the art, the second area 2A may not be uniformly supported by the electronic chip EC, so that the substrate 100 or the like may be deformed in the second area 2A. However, in the display apparatus according to the present embodiment, since the compensating film CF mostly covers the second area 2A, even if the size of the electronic chip EC is smaller than the size of the second area 2A of the substrate 100, it is possible to prevent the substrate 100 from being deformed in the second area 2A.

In particular, as illustrated in FIG. 14, since a thickness of the compensating film CF is equal to a thickness of the electronic chip EC, substrate 100 may not be deformed in the second area 2A. In this case, by allowing mechanical properties including a modulus of the compensating film CF to be similar to mechanical properties including a modulus of the electronic chip EC, an anti-deformation effect with respect to the substrate 100 in the second area 2A may be further increased. The compensating film CF may cover all portions of the top surface of the substrate 100 which is between the bending area BA and an edge as illustrated in FIG. 14 or between the display area DA and an edge, except for the portion to which the electronic chip EC is attached. This may apply to a display apparatus which does not include a bending area.

In addition, when the flexible printed circuit board FPCB is attached to a portion of the peripheral area including an edge portion of the substrate 100 so that the flexible printed circuit board FPCB does not overlap with the electronic chip EC, as illustrated in FIGS. 13 and 14, the compensating film CF may even cover a portion of the flexible printed circuit board FPCB, the portion overlapping with the substrate 100, i.e., the flexible printed circuit board FPCB may be between the substrate 100 and the compensating film. In this regard, a thickness of a portion of the compensating film CF which covers the flexible printed circuit board FPCB may be smaller than a thickness of another portion of the compensating film CF, so that a distance from the top surface of the substrate 100 to a top surface of the compensating film CF may be uniform in all portions of the compensating film CF, i.e., the top surface of the compensating film may be planar. By doing so, mechanical properties such as hardness may be overall uniform in a structure including the substrate 100, the electronic chip EC, the flexible printed circuit board FPCB, and the compensating film CF in the second area 2A of the substrate 100, so that deformation of the substrate 100 may be minimized or prevented in a corresponding portion.

Figure 15:
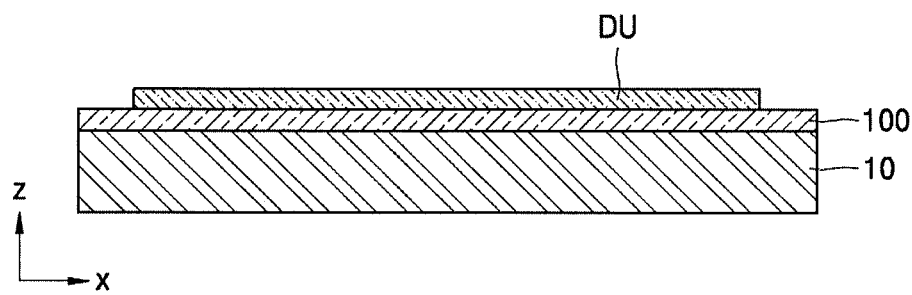
FIGS. 15 and 16 illustrate cross-sectional views of stages in a process of manufacturing a display apparatus, according to another embodiment.
Figure 16:
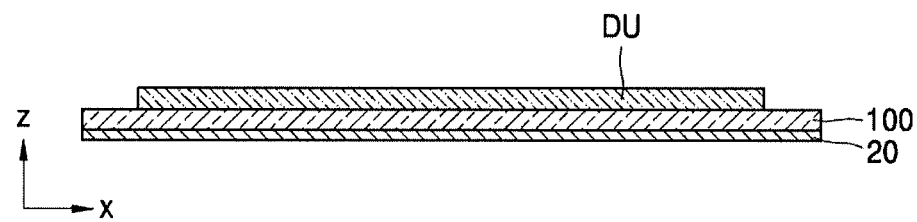

In the above descriptions, the plurality of display units DU are arranged on the mother substrate 100 and then the mother substrate 100 and the temporary protection film 20 are simultaneously cut, so that the plurality of display panels are achieved, but the present disclosure is not limited thereto. For example, the plurality of display panels may not be simultaneously achieved, and as illustrated in FIG. 15 that is a cross-sectional view illustrating a process of manufacturing a display apparatus according to another embodiment, the substrate 100 including a material having a flexible or bendable characteristic may be formed on a carrier substrate 10, and one display unit DU may be formed on a first area 1A of the substrate 100. Then, as illustrated in FIG. 16, the substrate 100 may be separated from the carrier substrate 10, and then the temporary protection film 20 may be bonded to a bottom surface (in −z direction) of the substrate 100 from which the carrier substrate 10 is separated.

In this case, as understood by one of ordinary skill in the art, the substrate 100 may initially have the first area 1A, a second area 2A, and a bending area BA between the first area 1A and the second area 2A, and the temporary protection film 20 may be bonded to a bottom surface of the substrate 100 while the temporary protection film 20 extends over the first area 1A, the bending area BA, and the second area 2A. In this regard, FIG. 5 may be understood to illustrate the portion of the display panel to which the temporary protection film 20 is bonded. Afterward, the aforementioned descriptions provided with reference to FIGS. 6 and 7 may be changelessly applied thereto.

Figure 17:
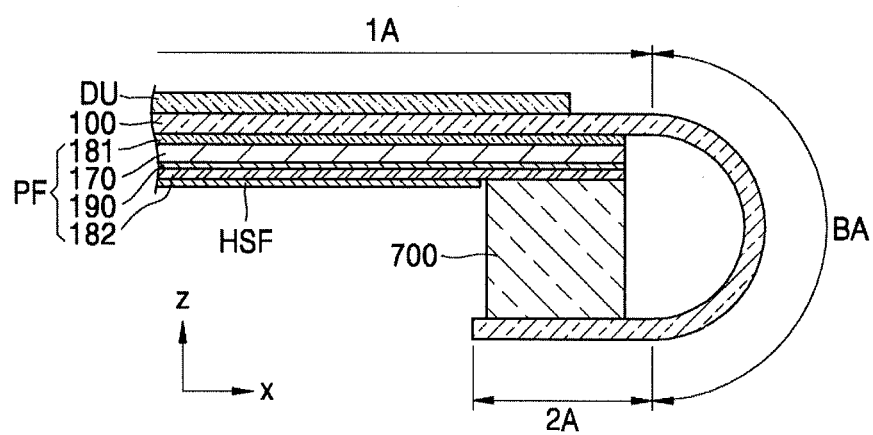
FIG. 17 illustrates a plan view of a portion of a display apparatus, according to another embodiment.

FIG. 17 is a plan view illustrating a portion of a display apparatus, according to another embodiment. As illustrated in FIG. 17, the display apparatus according to the present embodiment may include the substrate 100, the display unit DU, the protection film PF, and a supporting layer 700.

As described above, the substrate 100 may have the bending area BA between the first area 1A and the second area 2A and may have a shape bent with respect to a bending axis. Accordingly, a portion of a bottom surface of the substrate 100 in the first area 1A faces at least a portion of a bottom surface of the substrate 100 in the second area 2A.

The display unit DU is placed on a top surface of the substrate 100 so as to be located in the first area 1A. As described above with reference to FIGS. 5 through 7, the display unit DU may include the thin-film transistor 210 and the display device 300, and may further include the encapsulation layer 400, the OCA 510, and/or the polarizing plate 520.

The protection film PF including the first adhesive layer 181, the protection film base 170, the light blocking layer 190, and the second adhesive layer 182 is placed on a bottom surface of the substrate 100 and thus corresponds to at least a portion of the first area 1A. The supporting layer 700 is arranged between the protection film PF and the bottom of the substrate 100 in the second area 2A. The supporting layer 700 may include metal such as stainless and/or an elastic synthetic resin. The protection film PF may not be present in the bending area BA and the second area 2A. The supporting layer 700 may be bonded to the second adhesive layer 182 of the protection film PF and may contact the bottom of the substrate 100 in the second area 2A. In this case, an adhesive layer may be arranged between the supporting layer 700 and the bottom of the substrate 100 in the second area 2A, and if required, an additional another layer may be arranged between the protection film PF and the supporting layer 700. As illustrated in FIG. 17, the heat sink film HSF may be bonded to a portion of the protection film PF to which the supporting layer 700 is not bonded.

According to one or more embodiments, a display apparatus having a protection film with improved visibility may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a substrate;
a display device on a first surface of the substrate, the display device including a pixel electrode; and
a protection film on a second surface, opposite the first surface, of the substrate, wherein the protection film includes:
a first adhesive layer having a first surface that faces the second surface of the substrate;
a protection film base having a first surface that faces a second surface, opposite the first surface, of the first adhesive layer; and
a light blocking layer having a first surface that faces a second surface, opposite the first surface, of the protection film base, the light blocking layer overlapping with an entire area of the pixel electrode and blocking external light from background, wherein the protection film base is between the first adhesive layer and the light blocking film.

2. The display apparatus as claimed in claim 1, wherein the light blocking layer blocks visible light.

3. The display apparatus as claimed in claim 1, further comprising a heat sink film adjacent a second surface, opposite the first surface, of the light blocking layer.

4. The display apparatus as claimed in claim 3, wherein the protection film further includes a second adhesive layer between the light blocking layer and the heat sink film.

5. The display apparatus as claimed in claim 1, further comprising a cushion layer adjacent a second surface, opposite the first surface, of the light blocking layer.

6. The display apparatus as claimed in claim 5, wherein the protection film further includes a second adhesive layer between the light blocking layer and the cushion layer.

7. The display apparatus as claimed in claim 1, wherein the substrate has a display area and a peripheral area outside the display area,
the display device overlaps the display area,
the display apparatus further includes a printed circuit board mounted on a portion of the peripheral area including a first edge portion of the substrate, and
a length of the first edge portion is equal to a width of a part of the printed circuit board mounted on the first edge portion.

8. The display apparatus as claimed in claim 1, wherein the substrate has a display area and a peripheral area outside the display area, and the display device overlapping the display area, the display apparatus further comprising:
an electronic chip mounted on a portion of the peripheral area including a first edge portion of the substrate; and a compensating film having a first surface that contacts the first surface of the substrate, the compensating film covering the first surface of the substrate between the display area and the first edge portion.

9. The display apparatus as claimed in claim 8, wherein a thickness of the compensating film is equal to a thickness of the electronic chip.

10. The display apparatus as claimed in claim 8, wherein the compensating film completely covers the top surface of the substrate which is between the display area and the first edge portion, except for the portion to which the electronic chip is attached.

11. The display apparatus as claimed in claim 8, further comprising
a printed circuit board attached to the portion of the peripheral area having the first edge portion, wherein:
the printed circuit board does not overlap the electronic chip, and
the compensating film covers a portion of the printed circuit board that overlaps the substrate.

12. The display apparatus as claimed in claim 11, wherein a distance from the first surface of the substrate to a second surface, opposite the first surface, of the compensating film is uniform in an entire portion of the compensating film.

13. The display apparatus as claimed in claim 1, wherein the first surface of the first adhesive layer has an uneven surface.

14. The display apparatus as claimed in claim 1, wherein:
the substrate includes a first area, a second area, and a bending area between the first and second areas, the substrate being bent in the bending area
the substrate includes a display area and a peripheral area outside the display area,
the display area is in the first area,
the display device overlaps the display area, and
the peripheral area is in the first area, the second area, and the bending area.

15. The display apparatus as claimed in claim 14, wherein the protection film is not in the bending area.

16. The display apparatus as claimed in claim 14, further comprising
a bending protection layer extending in the first direction, the bending protection layer being in a portion of the first area, the bending area, and a portion of the second area.

17. The display apparatus as claimed in claim 14, further comprising
a conductive layer having an uneven surface overlapping the bending area.

18. The display apparatus as claimed in claim 17, wherein a width of the uneven surface is greater than a width of the bending area.

19. A display apparatus as claims in claim 14, further comprising:
an electronic chip mounted on a portion of the peripheral area including a first edge portion of the substrate; and
a compensating film having a first surface that contacts the first surface of the substrate, the compensating film covering the first surface of the substrate between the bending area and the first edge portion.

20. A display apparatus as claimed in claim 19, wherein a thickness of the compensating film is equal to a thickness of the electronic chip.

* * * * *